United States Patent [19]

Muramatsu

[11] 3,854,101

[45] Dec. 10, 1974

[54] DIFFERENTIAL AMPLIFIERS

[75] Inventor: Sadao Muramatsu, Tokyo, Japan

[73] Assignee: Yashica Co., Ltd., Tokyo, Japan

[22] Filed: Sept. 4, 1973

[21] Appl. No.: 394,069

[30] Foreign Application Priority Data

Sept. 18, 1972 Japan .............................. 47-93496

[52] U.S. Cl. ................. 330/30 D, 307/304, 330/23, 330/35, 330/69

[51] Int. Cl. ............................................. H03f 3/68

[58] Field of Search ............ 307/304; 330/30 D, 35, 330/69, 23

[56] References Cited

UNITED STATES PATENTS

R27,668 6/1973 Soltz et al. ........................ 330/35 X

*Primary Examiner*—H. K. Saalbach
*Assistant Examiner*—Lawrence J. Dahl
*Attorney, Agent, or Firm*—Dike, Bronstein, Roberts, Cushman & Pfund

[57] ABSTRACT

In a differential amplifier including a pair of field effect transistors wherein output terminals are connected to the drain electrodes, input terminals are connected to the gate electrodes, a variable resistor is connected between the source electrodes and an intermediate point of the variable resistor is connected to a source of constant current, a transistor is associated with each one of the field effect transistors, the base electrode of each transistor is connected to the drain electrode of one field effect transistor associated therewith, and the collector electrode of each transistor is connected to the source electrode of the other field effect transistor.

4 Claims, 7 Drawing Figures

DIFFERENTIAL AMPLIFIERS

BACKGROUND OF THE INVENTION

This invention relates to the improvement of a differential amplifier utilizing field effect transistors.

Field effect tansistors are now widely used as various types of DC amplifiers, AC amplifiers and the like because their input impedance is high. However, as such amplifiers have a defect of drift, a differential amplifier has been proposed to cancell out the effect of drift.

While a number of types of such differential amplifiers have been proposed, typical examples thereof are illustrated in FIGS. 1 and 2 of the accompanying drawing. The circuit shown in FIG. 1 comprises a pair of differentially connected field effect transitors with their source electrodes connected to be driven from a source of constant current. More particularly, the gate electrodes $G_1$ and $G_2$ of field effect transistors $Tr_1$ and $Tr_2$ are connected to input terminals, the source electrodes $S_1$ and $S_2$ are connected to the ground through a common source of constant current I and the drain electrodes $D_1$ and $D_2$ are connected to a source of voltage $V_B$ respectively through a resistor $R_1$ and a variable resistor $VR_1$. The output terminals $O_1$ and $O_2$ of the differential amplifiers are connected to the drain electrodes $D_1$ and $D_2$, respectively.

The differential amplifier shown in FIG. 1 operates as follows. Input signals Vin and −Vin respectively impressed upon the gate electrodes $G_1$ and $G_2$ are amplified by field effect transistors $Tr_1$ and $Tr_2$, respectively, to provide an output signal across the output terminals $O_1$ and $O_2$. The variable resistor $VR_1$ is adjusted such that when the input signals impressed upon the gate electrodes are equal, transistors $Tr_1$ and $Tr_2$ will produce equal outputs. Under these conditions, the gate-source voltages of two field effect transistors are equal but their drain currents are not generally equal. Since the drain currents are governed by the characteristics of the field effect transistors even when the input voltages are equal, the drain currents are not always equal. For this reason, the forward transfer admittance of the pair of field effect transistors are not equal thereby degrading the ratio of the same phase component to the reverse phase component of the output, that is the discrimination ratio. This impairs the stability of the operation of the amplifier. For this reason, it is necessary to select field effect transistors having the same operating characteristic. Otherwise, it is impossible to perfectly compensate for the variation in the drift due to temperature variation. Thus, the temperature drift caused by the difference in the temperature characteristics of the pair of field effect transistors will be increased so that even when the amplification factor of the amplifier is increased, the drift expressed in terms of the input becomes significant.

In the circuit shown in FIG. 2, a variable resistor $VR_2$ is connected across the source electrodes $S_1$ and $S_2$ of a pair of field effect transistors $Tr_1$ and $Tr_2$ so as to equalize their forward transfer impedances and the variable tap of the resistor $VR_2$ is connected to a common source of constant current I. The circuit components corresponding to those shown in FIG. 1 are designated by the same reference letters. In the circuit shown in FIG. 2, a fixed resistor $R_2$ is substituted for the variable resistor $VR_1$ connected between the drain electrode $D_2$ of field effect transistor $Tr_2$ and the source $V_B$.

With the circuit shown in FIG. 2 by adjusting the variable resistor $VR_2$, it is possible to make substantially equal the forward transfer admittances of both field effect transistors thereby improving the discrimination ratio over that of the circuit shown in FIG. 1. In addition, as it is possible to make substantially equal the temperature coefficients of the two field effect transistors, it is possible to improve the temperature drift. However, as the voltage drift caused by the variation in the source voltage is nearly equal to that of the circuit shown in FIG. 1, the gain of the amplifier circuit decreases by an amount corresponding to the feedback provided by the variable resistor connected across the source electrodes $S_1$ and $S_2$, whereby the voltage drift expressed in terms of the input voltage is much significant than that of the circuit shown in FIG. 1.

SUMMARY OF THE INVENTION

It is an object of this invention to provide an improved differential amplifier of the type utilizing field effect transistors which can improve the gain, discrimination gain and drift.

Another object of this invention is to provide an improved differential amplifier of the type utilizing a pair of field effect transistors in which the balanced conditions of the amplifier can be readily established irrespective of the difference in the operating characteristics of the field effect transistors.

According to one aspect of this invention there is provided a differential amplifier of the class including a pair of field effect transistors, output terminals connected to the drain electrodes of the field effect transistors, input terminals connected to the gate electrodes of the field effect transistors, a variable resistor connected between the source electrodes of the field effect transistors, and a source of constant current connected to an intermediate point of the variable resistor, characterized in that a transistor is associated with each one of the field effect transistors, that the base electrode of each transistor is connected to the drain electrode of one field effect transistor associated therewith, and that the collector electrode of each transistor is connected to the source electrode of the other field effect transistor.

According to another aspect of this invention there is provided an amplifier comprising a field effect transistor having a gate electrode connected to an input terminal, a source electrode connected to the ground through a resistor, and a drain electrode connected to an output terminal and to a source of voltage through a resistor; and a transistor having a base electrode connected to the drain electrode of the field effect transistor, an emitter electrode connected to the source electrode of the field effect transistor and a collector electrode connected to the source.

BRIEF DESCRIPTION OF THE DRAWINGS

Further objects and advantages of the invention will be more fully understood from the following detailed description taken in conjunction with the accompanying drawings, in which.

DESCRIPTION OF THE PREFERRED EMBODIMENT

Figure 3:
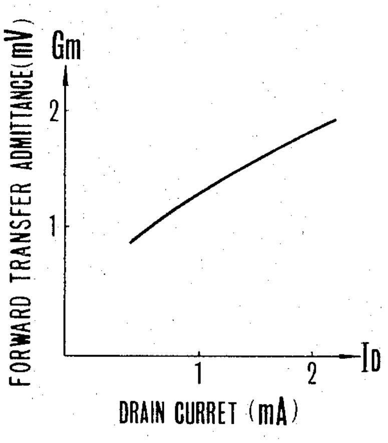
FIGS. 3 and 4 are diagrams showing operating characteristics of the field effect transistor utilized in the differential amplifier of this invention.

In order to have better understanding of this invention, the characteristics of the field effect transistor utilized therein will first be described with reference to FIGS. 3 and 4. The graph shown in FIG. 3 shows the relationship between the drain current $I_D$ and the forward transfer admittance $G_m$. In the field effect transistors manufactured in accordance with the same specification it is generally possible to make substantially equal their forward transfer admittance by making equal their drain current $I_D$.

Figure 4:
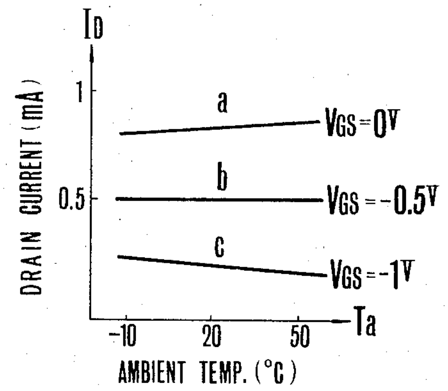

FIG. 4 shows the relationship between the ambient temperature Ta and the drain current $I_D$ in which $V_{GS}$ shows the voltage between the gate and source electrodes of the field effect transistor. As shown by curve *b*, when a suitable value (0.5 mA, in this case) of the drain current $I_D$ is selected, it is possible to make substantially constant the drain current $I_D$ irrespective of the variation in the ambient temperature.

Figure 5:
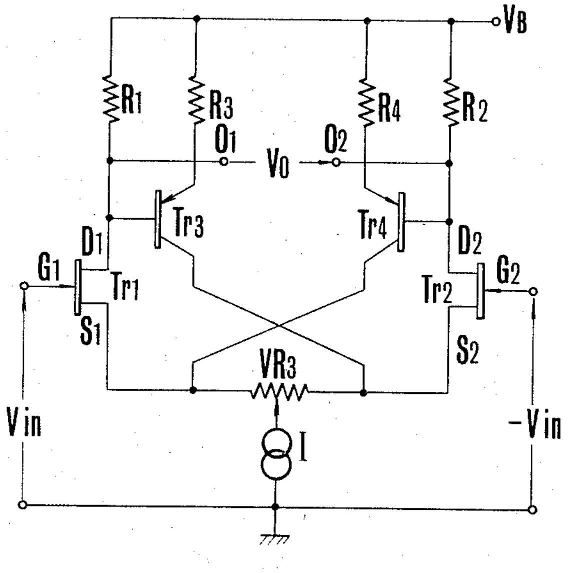
FIG. 5 shows a connection diagram of one example of the differential amplifier embodying the invention.

In a preferred embodiment of this invention illustrated in FIG. 5, the gate electrode $G_1$ of a first field effect transistor $Tr_1$ is connected to an input terminal, the source electrode $S_1$ is connected through a variable resistor $VR_3$ with the source electrode $S_2$ of a second field effect transistor $Tr_2$ with its gate electrode $G_2$ connected to the other input terminal. The movable tap of the variable resistor $VR_3$ is grounded through a source of constant current I. The drain electrode $D_1$ of the first field effect transistor $Tr_1$ is connected to a source of voltage $V_B$ via resistor $R_1$ and to the base electrode of a transistor $Tr_3$. The collector electrode of transistor $Tr_3$ is connected to the source electrode $S_2$ of the second field effect transistor $Tr_2$, whereas the emitter electrode of transistor $Tr_3$ is connected to the source $V_B$ through a resistor $R_3$. The drain electrode $D_2$ of the second field effect transistor $Tr_2$ is connected to the source $V_B$ through a resistor $R_2$ and directly to the base electrode of a transistor $Tr_4$. The collector electrode of transistor $Tr_4$ is connected to the source electrode $S_1$ of the first field effect transistor $Tr_1$, whereas the emitter electrode of transistor $Tr_4$ is connected to the source $V_B$ via a resistor $R_4$.

The differential amplifier shown in FIG. 5 operates as follows. First, variable resistor $VR_3$ is adjusted to obtain a balanced condition of the differential amplifier. Since it is possible to make equal the drain currents of the first and second field effect transistors $Tr_1$ and $Tr_2$ and to make equal the collector currents flowing through transistors $Tr_3$ and $Tr_4$ when equal inputs are applied to the gate electrodes $G_1$ and $G_2$ of the field effect transistors $Tr_1$ and $Tr_2$, it is possible to make substantially equal the forward transfer admittances of these field effect transistors by adjusting the variable resistor $VR_3$.

Upon application of an input $+\Delta Vin$ upon the gate electrode $G_1$ of the first field effect transistor $Tr_1$ and an input $-\Delta Vin$ upon the gate electrode $G_2$ of the second field effect transistor $Tr_2$, in response to these inputs, the drain current of the first field effect transistor $Tr_1$ increases, whereas that of the second field effect transistor $Tr_2$ decreases by an amount equal to the increase in the drain current of the first field effect transistor $Tr_1$. If transistors having a large current amplification factor $h_{FE}$ were selected as transistors $Tr_3$ and $Tr_4$ they would operate as emitter followers with full negative feedbacks so that their voltage amplification factors would be substantially equal to unity. As a result, the collector current of transistor $Tr_3$ increases an amount equal to the increase in the drain current of the first field effect transistor $Tr_1$, whereas the collector current of transistor $Tr_4$ decreases by the same amount. Since the drain current of the first field effect transistor $Tr_1$ and the collector current of the transistor $Tr_4$ flow through the lefthand portion of the variable resistor $V_3$ connected to the source electrode $S_1$ of the first field effect transistor $Tr_1$ the total current flowing through the lefthand portion of the variable resistor $VR_3$ will not be varied by the input signals. Similarly, since the drain current of the second field effect transistor $Tr_2$ and the collector current of transistor $Tr_3$ flow through the righthand portion of the variable resistor $VR_3$ connected to the source electrode $S_2$ of the second field effect transistor $Tr_2$, the total current flowing through the righthand portion of the variable resistor $VR_3$ will not be varied by the input signals. Accordingly, it is possible to produce output signals at high gains across output terminals without affecting in any way the circuit gain by the variable resistor $VR_3$.

Figure 6:
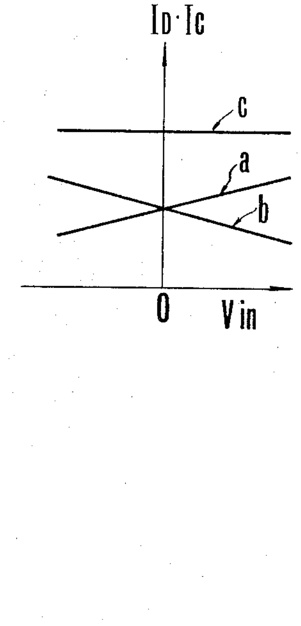
FIG. 6 is a plot used to explain the operation of the differential amplifier shown in FIG. 5.

FIG. 6 shows the relationship between input signal voltage Vin and drain current $I_D$ and collector current $I_C$ in which curve *a* shows the drain current of the first field effect transistor $Tr_1$ and the collector current of the transistor $Tr_3$, curve *b* shows the collector current of the second field effect transistor $Tr_2$ and the collector current of transistor $Tr_4$, and curve *c* shows the current flowing through the variable resistor $VR_3$ connected across the source electrodes of the first and second field effect transistors $Tr_1$ and $Tr_2$.

Figure 1:
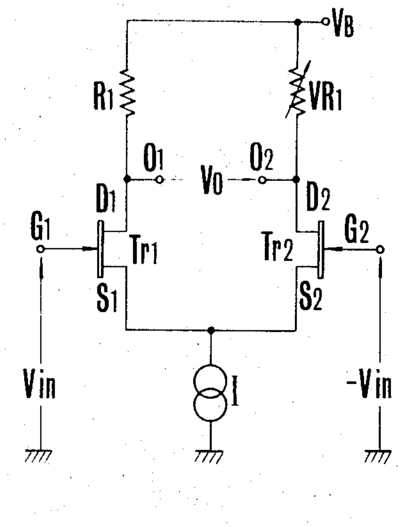
FIG. 1 PRIOR ART
FIGS. 1 and 2 illustrate the connection diagrams of two typical prior art differential transformers using field effect transistors.
Figure 2:
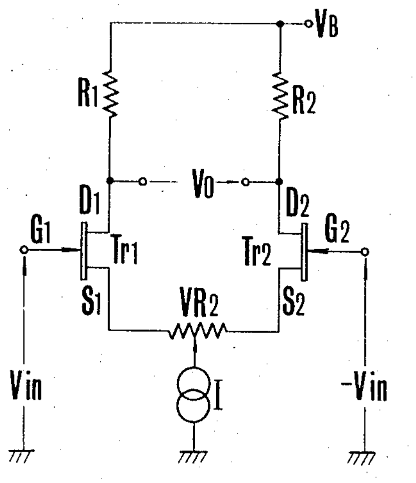
FIG. 2 PRIOR ART

Denoting the forward transfer admittance of the first and second field effect transistors by *gm*, the load by R and the balancing variable resistance connected across the source electrodes by $V_R$, the gain of the circuit shown in FIG. 2 is represented by $gm^R/1 + gm^{V}R$, whereas that of the circuit shown in FIG. 5 by $gm^R$. This means that the variable resistor $VR_3$ contributes solely to the equalization of the characteristics of two field effect transistors and does never act as a negative feedback to the input signal.

The field effect transistors constituting the differential amplifier of this invention operate with their source electrodes grounded in response to the input signals impressed upon their gate electrodes. Concurrently therewith the collector currents flowing through transistors associated with the field effect transistors apply signals to the source electrodes thereof so that the field effect transistors operate as if their gate electrodes were grounded. As a consequence, each field effect transistor operates as two cascade connected field effect transistors. Accordingly, when compared with a prior art differential amplifier shown in FIG. 2, it is possible to readily improve the discrimination ratio and to decrease the drift expressed in terms of the input by increasing the gain. In the prior circuit, the drain current $I_{DSS}$ (the drain current at $V_{GS} = 0$ shown by curve *a* in FIG. 4) of field effect transistors manufactured according to the same specification varies by a factor of two or three so that it has been impossible to perfectly balance the differential amplifier for the purpose of increasing its gain unless connecting a variable resistor having a large resistance across the source electrodes of the field effect transistors so as to provide a large negative feedback. On the contrary, according to this invention, it is possible not only to improve several times the gain but also to greatly improve the discrimination ratio and the drift. Moreover, according to this invention, it is possible to select the circuit constants such that the collector currents of transistors are made larger than the drain currents of the field effect transistors thereby improving further the gain.

While in the foregoing embodiment the invention has been described as applied to a double ended differential amplifier having two input terminals and two output terminals it should be understood that the invention is not limited to such a type of the differential amplifier but may be applied to a single ended differential amplifier having a single input and a single output.

Figure 7:
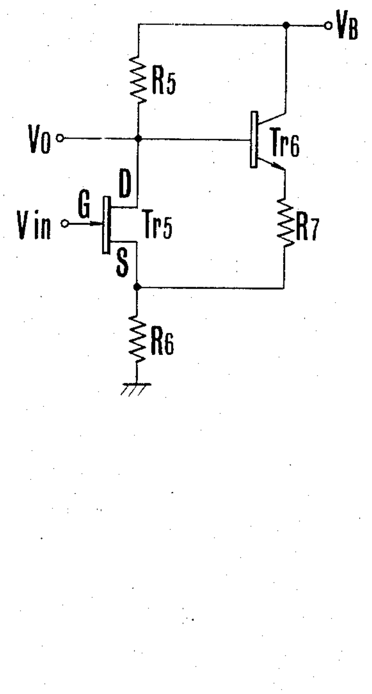
FIG. 7 is a connection diagram of a modified embodiment of this invention.

FIG. 7 shows such an embodiment in which the gate electrode G of a field effect transistor $Tr_5$ is connected to an input terminal, the source electrode S is grounded through a resistor $R_6$ and drain electrode D is connected to a source of voltage $V_B$. There is also provided a NPN-type transistor $Tr_6$ having a base electrode connected to the drain electrode of the field effect transistor $Tr_5$, a collector electrode connected to the source $V_B$ and an emitter electrode connected to the source electrode S of the field effect transistor through a resistor $R_7$. When an input voltage Vin is impressed upon the gate electrode G of the single ended amplifier constructed as above described, this input is amplified by the field effect transistor $Tr_5$ to produce an output voltage at its output terminal.

As has been described hereinabove the invention provides a differential amplifier having a simplified construction yet can improve the discrimination ratio, temperature and voltage drifts, and can operate stably with high gains even when the ambient temperature and source voltage vary over wide ranges.

What is claimed is:

1. In a differential amplifier of the type including a pair of field effect transistors, output terminals connected to the drain electrodes of said field effect transistors, input terminals connected to the gate electrodes of said field effect transistors, a variable resistor connected between the source electrodes of said field effect transistors, and a source of constant current connected to an intermediate point of said variable resistor, the improvement which comprises a pair of transistors each associated with one of said field effect transistors, means for connecting the base electrode of each transistor to the drain electrode of one field effect transistor associated therewith, and means to connect the collector electrode of each transistor to the source electrode of the other field effect transistor.

2. The differential amplifier according to claim 1 wherein one terminal of said variable resistor connected to the source electrode of one field effect transistor is connected to the base electrode of one transistor associated with the other field effect transistor and the other terminal of said variable resistor connected to the source electrode of said other field effect transistor is connected to the base electrode of the other transistor associated with said one field effect transistor.

3. The differential amplifier according to claim 1 wherein the drain electrodes of said field effect transistors and the emitter electrodes of said transistors are connected to a source of voltage respectively through resistors.

4. An amplifier comprising a field effect transistor having a gate electrode connected to an input terminal, a source electrode connected to the ground through a resistor, and a drain electrode connected to an output terminal and to a source of voltage through a resistor, and a transistor having a base electrode connected to the drain electrode of said field effect transistor, an emitter electrode connected to the source electrode of said field effect transistor and a collector electrode connected to said source.

* * * * *